United States Patent [19]
Auvinen et al.

[11] Patent Number: 4,802,122
[45] Date of Patent: Jan. 31, 1989

[54] FAST FLUSH FOR A FIRST-IN FIRST-OUT MEMORY

[75] Inventors: Stuart T. Auvinen, Capitola; Barry A. Hoberman, Mountain View, both of Calif.

[73] Assignee: Advanced Micro Devices, Inc., Sunnyvale, Calif.

[21] Appl. No.: 43,521

[22] Filed: Apr. 28, 1987

[51] Int. Cl.$^4$ ............................................. G11C 11/00
[52] U.S. Cl. .................................. 365/154; 365/190
[58] Field of Search ............... 365/154, 156, 189, 190, 365/202

[56] References Cited

U.S. PATENT DOCUMENTS

| | | | |
|---|---|---|---|
| 4,447,891 | 5/1984 | Kadota | 365/154 |
| 4,535,427 | 8/1985 | Jiang | 365/190 X |
| 4,541,076 | 9/1985 | Bowers et al. | 365/190 |

Primary Examiner—Joseph A. Popek
Attorney, Agent, or Firm—Alan H. MacPherson; Paul J. Winters; Brian D. Ogonowsky

[57] ABSTRACT

In a memory circuit including a write bit-line for writing data into a memory cell, and a read bit-line for reading data from the cell, a transistor is included, connected with the write bit-line and the read bit-line, so that when a fast flush signal is applied to the gate of that transistor, direct connection is made between the write bit-line and read bit-line, so that data is written into the cell, but can be read simultaneously from the read bit-line, reducing the fall-through delay.

4 Claims, 1 Drawing Sheet

FAST FLUSH FOR A FIRST-IN FIRST-OUT MEMORY

FIELD OF THE INVENTION

This invention relates to memory cell circuits, and more particularly, to a memory cell circuit capable of minimizing fall-through delay.

PRIOR ART

In a typical dual-port memory cell for a first-in first-out memory circuit, the cell is provided with a pair of write bit-lines through which data, in the form of a 1 or a 0, may be entered into the cell. The cell is likewise connected to a pair of read bit-lines through which one can read the contents of the cell.

In such a first-in first-out memory circuit, data entered at the inputs appears at the outputs in the same order, the data "falling through" to the output queue with a small delay. While such typical design is rapid and effective in use, it is generally desirable to reduce the overall delay time for providing to the output queue the data written into the memory.

SUMMARY

The present invention allows for rapid access to the data on memory cell write bit-lines by the read bit-lines of that memory cell in the case where the memory cell is being accessed by appropriate row and column pointers.

Broadly stated, in accordance with the invention, a circuit is provided for minimizing the fall-through delay of data in a first-in first-out memory circuit. The circuit includes one or more write bit-lines connected with the memory cell for communicating data to the cell, one or more read bit-lines connected with the memory cell for communicating data from the cell, and means selectively connecting the write bit-line(s) with the read bit-line(s) independent of the cell so that data carried by the write bit-line(s) can be communicated to the read bit-line(s) independent of the memory cell

BRIEF DESCRIPTION OF THE DRAWINGS

Other objects of the invention will become apparent from a study of the following specification and drawing, which is a schematic view of the circuit incorporating the invention.

DESCRIPTION OF THE PREFERRED EMBODIMENT

Figure 1:
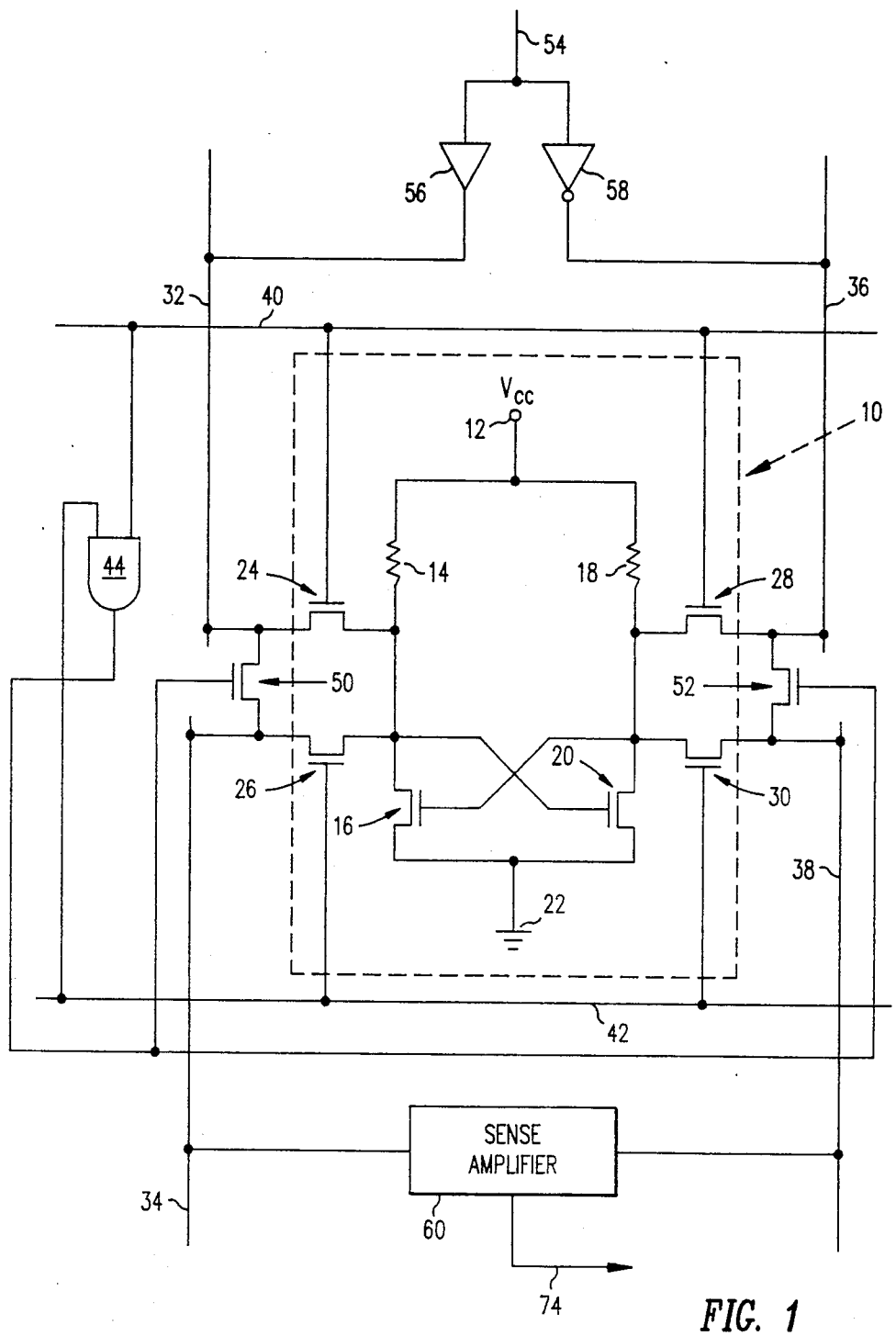

Referring to the drawing, a memory cell 10 is shown in the dotted box, which cell 10 is part of a memory array.

The memory cell 10 includes a voltage supply terminal 12, a resistor 14 connected to the voltage supply terminal, and an N-channel MOS transistor 16 having its drain connected to the resistor 14. In parallel with the resistor 14 and transistor 16 are another resistor 18 connected to the voltage supply terminal 12, and another N-channel MOS transistor 20 having its drain connected to the resistor 18. The sources of the transistors 16, 20 are connected to a ground terminal 22. The drain of transistor 16 is connected to the gate of transistor 20, while the drain of transistor 20 is connected to the gate of transistor 16.

N-channel MOS transistors 24, 26 have their sources connected to the drain of the transistor 16, while N-channel MOS transistors 28, 30 have their sources connected to the drain of the transistor 20. The drain of the transistor 24 connects to the external write bit-line 32, while the drain of the transistor 26 connects to the external read bit-line 34. Similarly, the drain f the transistor 28 connects to another external write bit-line 36, while the drain of the transistor 30 connects to another external read bit-line 38. The gates of the transistors 24, 28 connect to the external write row line 40, while the gates of the transistors 26, 30 connect to the external read row line 42. The logic states of the write row line 40 and read row line 42 are input into an AND gate 44. The output signal of the AND gate 44 is input to the gates of N-channel MOS transistors 50, 52, the transistor 50 providing connection between the write bit-line 32 and read bit-line 34 in the transistor 50 on condition, with the transistor 52 providing connection between the write bit-line 36 and read bit-line 38 in the transistor 52 on condition.

Data is communicated from the data input line 54 through a buffer 56 to the write bit-line 32 and through an inverter 58 to the write bit-line 36. Thus, whatever the state of the input signal, the write bit-line 32 and write bit-line 36 will carry opposite values (D and $\bar{D}$). Assuming, for example, that a 1 is provided as the input signal on line 54 to be written into the memory cell 10, the write bit-line 32 will carry a high signal and the write bit-line 36 will carry a low signal. The write row line 40 is activated to turn transistors 24, 28 on, so that the drain of transistor 16 goes high, turning the gate of transistor 20 on and bringing the drain of transistor 20 and the gate of transistor 16 low, so that transistor 16 is in the off state, and transistor 20 is in the on state.

Assuming that such data is needed to be read from the memory cell 10, the read row line 42 is activated, turning on transistors 26, 30, and the cell's data is placed on the read bit lines 34, 38, and the data applied to a sense amplifier 60, communicating with line 74, and from which the ultimate output is taken.

In the present circuit, upon the write row line 40 and read row line 42 being simultaneously addressed, the signal from the AND gate 44 is high. The transistors 50, 52 are turned on, providing direct communication between the write bit-line 32 and read bit-line 34, and also between the write bit-line 36 and read bit-line 38. Thus, in this situation, data is written into the memory cell 10 as was previously described. However, because of the direct communication between the lines as described above, the data being supplied by the write bit-lines 32, 36 can be read faster than in the prior art description, since the data is transferred directly from the write bit-lines 32, 36 through transistors 50, 52 to the read bit-lines 34, 38.

It will be understood that the presently-described invention is not to be limited to first-in first-out memory cells only, but can be applied to any dual-port memory cell.

A preferred embodiment has been illustrated, of which modifications and adaptations within the scope of the invention will occur to those skilled in the art. The invention is limited only by the scope of the following claims.

We claim:

1. A circuit for reducing the fall-through delay of data in a memory cell comprising:
    a write bit-line connected with the memory cell for communicating data to the cell;

a read bit-line connected with the memory cell for communicating data from the cell; and means selectively connecting the write bit-line with the read bit-line independent of the memory cell so that data carried by the write bit-line can be communicated to the read bit-line independent of the memory cell.

2. The circuit of claim 1 wherein the means for selectively connecting the write bit-line to the read bit-line independent of the memory cell comprise switch means operatively associated with the write bit-line and read bit-line.

3. The circuit of claim 2 wherein the switch means comprises an MOS transistor having a drain connected to the write bit-line, a source connected to the read bit-line, and a gate to which a signal may be applied for selectively providing communication through said MOS transistor between the write bit-line and the read bit-line.

4. The circuit of claim 3 and further comprising a sense amplifier connected with the read bit-line for receiving data therefrom.

* * * * *

REEXAMINATION CERTIFICATE (1995th)

United States Patent [19]

Auvinen et al.

[11] B1 4,802,122

[45] Certificate Issued  May 4, 1993

[54] FAST FLUSH FOR A FIRST-IN FIRST-OUT MEMORY

[75] Inventors: Stuart T. Auvinen, Capitola; Barry A. Hobermann, Mountain View, both of Calif.

[73] Assignee: Monolithic Memories, Inc.

Reexamination Request:
No. 90/002,521, Nov. 25, 1991

Reexamination Certificate for:
Patent No.: 4,802,122
Issued: Jan. 31, 1989
Appl. No.: 43,521
Filed: Apr. 28, 1987

[51] Int. Cl.[5] .................................. G11C 11/00
[52] U.S. Cl. ........................ 365/154; 365/190; 365/221
[58] Field of Search ............ 365/154, 156, 190, 202, 365/189.04, 221

[56] References Cited

U.S. PATENT DOCUMENTS 4,447,891  5/1984  Kadota .......................... 365/154
4,535,427  8/1985  Jiang ........................... 365/190 X
4,541,076  9/1985  Bowers et al. .................. 365/190
4,599,708  7/1986  Schuster ........................ 365/174
4,833,651  5/1989  Seltzer et al. ................. 365/189.07
4,833,655  5/1989  Wolf et al. ..................... 365/221

FOREIGN PATENT DOCUMENTS 0149049  7/1985  European Pat. Off. .
8403377  8/1984  World Int. Prop. O. .

OTHER PUBLICATIONS

Yeung, "A 300MHz Bipolar-CMOS Video Shift Register with FIFO"; ISSCC 1987, Digest of Technical Papers, pp. 56,57,338 (Feb. 25, 1987).

*Primary Examiner*—Joseph A. Popek

[57] ABSTRACT

In a memory circuit including a write bit-line for writing data into a memory cell, and a read bit-line for reading data from the cell, a transistor is included, connected with the write bit-line and the read bit-line, so that when a fast flush signal is applied to the gate of that transistor, direct connection is made between the write bit-line and read bit-line, so that data is written into the cell, but can be read simultaneously from the read bit-line, reducing the fall-through delay.

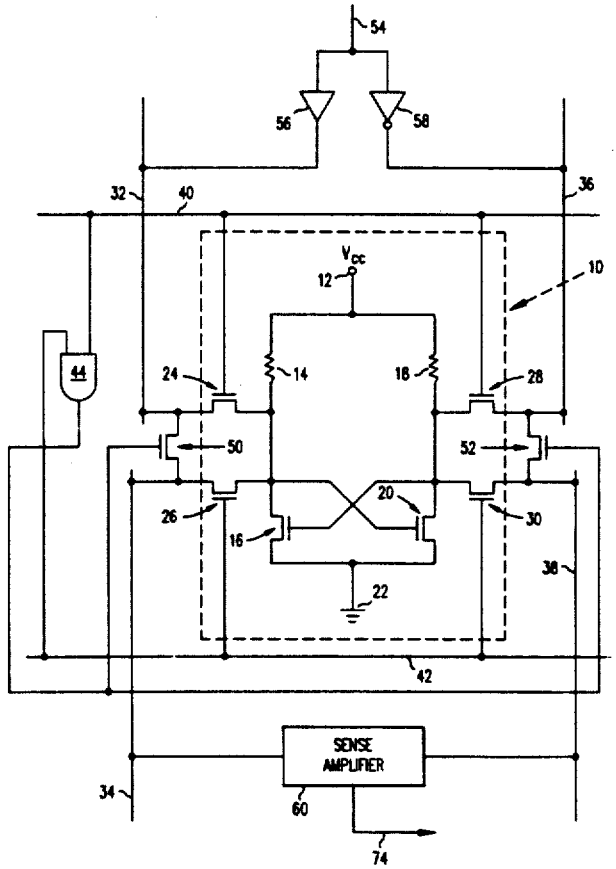

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 to 4 is confirmed.

New claims 5 to 14 are added and determined to be patentable.

*5. The circuit of claim 1, wherein the memory cell is one of a plurality of memory cells in a memory which further has read row lines and write row lines, each of the plurality of memory cells being enabled for write access by one of the write row lines coupled to the memory cell, and being enabled for read access by one of the read row lines coupled to the memory cell,*

*and wherein the means for selectively connecting the write bit line to the read bit line independent of the memory cell comprises:*

*a switch connecting the write bit line to the read bit line in response to a control signal; and*

*a logic gate having a first input coupled to the write row line for the memory cell, a second input coupled to the read row line for the memory cell, and an output asserting the control signal only when both the write row line and the read row line for the memory cell are asserted.*

*6. The circuit of claim 3, wherein the memory cell is one of a plurality of memory cells in a memory which further has read row lines and write row lines, each of the plurality of memory cells being enabled for write access by one of the write row lines coupled to the memory cell, and being enabled for read access by one of the read row lines coupled to the memory cell,*

*and wherein the means for selectively connecting the write bit line to the read bit line independent of the memory cell further comprises a logic gate having a first input coupled to the write row line for the memory cell, a second input coupled to the read row line for the memory cell, and an output connected to the gate of the MOS transistor, the logic gate asserting a signal on its output only when both the write row line and the read row line for the memory cell are asserted.*

*7. The circuit of claim 4, wherein the memory cell is one of a plurality of memory cells in a memory which further has read row lines and write row lines, each of the plurality of memory cells being enabled for write access by one of the write row lines coupled to the memory cell, and being enabled for read access by one of the read row lines coupled to the memory cell,*

*and wherein the means for selectively connecting the write bit line to the read bit line independent of the memory cell further comprises a logic gate having a first input coupled to the write row line for the memory cell, a second input coupled to the read row line for the memory cell, and an output connected to the gate of the MOS transistor, the logic gate asserting a signal on its output only when both the write row line and the read row line for the memory cell are asserted.*

*8. The circuit of claim 1, wherein the memory cell is one of a plurality of memory cells in first-in, first-out memory.*

*9. The circuit of claim 2, wherein the memory cell is one of a plurality of memory cells in first-in, first-out memory.*

*10. The circuit of claim 3, wherein the memory cell is one of a plurality of memory cells in first-in, first-out memory.*

*11. The circuit of claim 4, wherein the memory cell is one of a plurality of memory cells in first-in, first-out memory.*

*12. The circuit of claim 5, wherein the memory is a first-in, first-out memory.*

*13. The circuit of claim 6, wherein the memory is a first-in, first-out memory.*

*14. The circuit of claim 7, wherein the memory is a first-in, first-out memory.*

* * * * *